United States Patent [19]

Tamura

[11] Patent Number: 4,739,175
[45] Date of Patent: Apr. 19, 1988

[54] APPARATUS FOR INSPECTING CONFIGURATION OF TERMINAL LEGS OF AN ELECTRONIC DEVICE

[75] Inventor: Keiichi Tamura, Kamakura, Japan

[73] Assignee: Mitsubishi Denki Kabushiki Kaisha, Japan

[21] Appl. No.: 16,732

[22] Filed: Feb. 20, 1987

[30] Foreign Application Priority Data

Feb. 24, 1986 [JP] Japan .................................. 61-38586

[51] Int. Cl.[4] ............................................. G01N 21/88
[52] U.S. Cl. .................................. 250/561; 29/566.3; 250/224
[58] Field of Search .................... 250/561, 223 R, 224; 29/566.3, 705, 709, 710, 741; 356/241, 375

[56] References Cited

U.S. PATENT DOCUMENTS

| | | | |
|---|---|---|---|
| 4,264,202 | 4/1981 | Gugliotta et al. .................... | 250/561 |
| 4,499,649 | 2/1985 | Maxner ............................... | 29/566.3 |
| 4,549,087 | 10/1985 | Duncan et al. ..................... | 250/561 |
| 4,553,843 | 11/1985 | Langley et al. ..................... | 250/561 |

Primary Examiner—Edward P. Westin
Attorney, Agent, or Firm—Leydig, Voit & Mayer

[57] ABSTRACT

An apparatus for inspecting the configuration of terminal legs of an electronic device comprises a support base for supporting the electronic device to be inspected and a distance sensor, disposed at a predetermined distance from the electronic device, for measuring the distance to a particular point on a predetermined path across the terminal legs of the electronic device by a beam of light. The distance sensor provides an output signal representative of the distance between the sensor and the point on the predetermined path across the terminal legs. The apparatus also comprises drive mechanism for moving the distance sensor and the electronic device relative to each other at a predetermined speed along the predetermined travel path, thereby to move the beam of light across the terminal legs of the electronic device to be inspected so that the distance sensor can provide an output signal indicative of a measured profile of the terminal legs of the electronic device along the predetermined path. The apparatus further comprises a signal processing circuit including a reference signal generator for generating a reference signal representative of a desired reference profile of the terminal legs of the electronic device along the predetermined path. In order to determine whether or not the terminal legs of the electronic device being inspected are deformed as indicated by any discrepancy between the measured profile and the reference profile, a determination circuit is connected to the distance sensor and the reference signal generator for comparing the measured profile of the terminal legs with the reference profile of the terminal legs.

3 Claims, 3 Drawing Sheets

APPARATUS FOR INSPECTING CONFIGURATION OF TERMINAL LEGS OF AN ELECTRONIC DEVICE

BACKGROUND OF THE INVENTION

This invention relates to an electronic device inspection apparatus and more particularly to an apparatus for inspecting the configuration of terminal legs of an electronic device.

FIG. 1 illustrates in a schematic perspective view one example of a conventional electronic device inspection apparatus. The conventional apparatus includes a TV camera 20 for monitoring an electronic device 1 including a package mould 1a in which an integrated circuit (not shown) for example is hermetically sealed and two arrays of the terminal legs 2 on both sides of the package mould 1a. The terminal legs 2 are arranged at equal intervals.

With the above conventional inspection apparatus, a two-dimensional image of the terminal legs 2 to be inspected is taken by the TV camera 20, and the image of the terminal legs 2 is digitally processed to determine whether or not the terminal legs are positioned at the correct desired positions.

However, the conventional inspection apparatus as above described is disadvantageous in that, while any bend of the terminal legs within a plane perpendicular to the TV camera 20 can be easily detected, no upward or downward bend of the terminal legs can be detected because of the limits of the two-dimensional image of the terminal legs utilized. Also, the TV camera and the associated equipment necessary for image processing are very expensive components, making the resultant inspection apparatus expensive.

SUMMARY OF THE INVENTION

Accordingly, an object of the present invention is to provide an apparatus for inspecting the configuration of terminal legs of an electronic device free from the above discussed disadvantages of the conventional inspection apparatus.

Another object of the present invention is to provide an apparatus for inspecting the configuration of terminal legs of an electronic device in which the configuration of the array of the terminal legs of an electronic device can be inspected and monitored three-dimensionally.

Still another object of the present invention is to provide an apparatus for inspecting the configuration of terminal legs of an electronic device which is less expensive than the conventional inspection apparatus.

A further object of the invention is to provide an inspection apparatus less expensive compared to the conventional apparatus and yet capable of inspecting the configuration of the terminal legs of an electronic device three-dimensionally.

With the above object in view, the apparatus for inspecting the configuration of terminal legs of an electronic device according to the present invention comprises a support base for supporting the electronic device to be inspected and a distance sensor, disposed at a predetermined distance from the electronic device, for measuring the distance to a particular point on a predetermined path across the terminal legs of the electronic device by using a beam of light. The distance sensor provides an output signal representative of the distance between the sensor and the point on the predetermined path across the terminal legs. The apparatus also comprises drive means for moving the distance sensor and the electronic device relative to each other at a predetermined speed along the predetermined travel path, thereby to move the beam of light across the terminal legs of the electronic device to be inspected so that the distance sensor provides an output signal indicative of a measured profile of the terminal legs of the electronic device along the predetermined path. The apparatus further comprises a signal processing circuit including a reference signal generator for generating a reference signal representative of a desired reference profile of the terminal legs of the electronic device along the predetermined path. In order to determine whether or not the terminal legs of the electronic device being inspected are deformed based on any discrepancies between the measured profile and the reference profile, a determination circuit is connected to the distance sensor and the reference signal generator for comparing the measured profile of the terminal legs with the reference profile of the terminal legs.

BRIEF DESCRIPTION OF THE DRAWINGS

The present invention will become more readily apparent from the following detailed description of the preferred embodiment of the present invention taken in conjunction with the accompanying drawings, in which.

DETAILED DESCRIPTION OF THE PREFERRED EMBODIMENT

Figure 1:
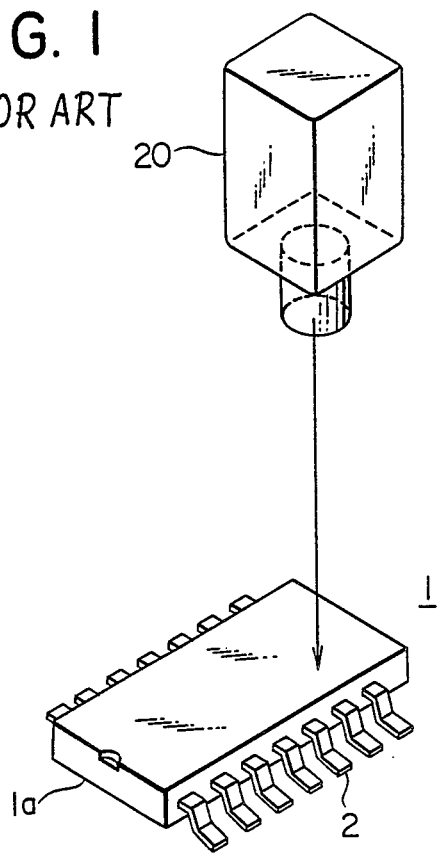
FIG. 1 is a schematic perspective view of a conventional inspection apparatus employing a TV camera.
Figure 2:
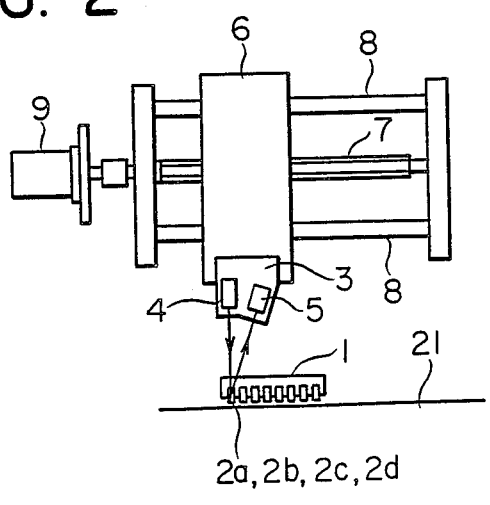
FIG. 2 is a schematic view of an apparatus for inspecting the configuration of terminal legs of an electronic device according to the present invention.
Figure 3:
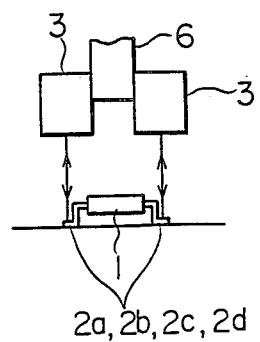
FIG. 3 is a fragmental side view of the apparatus shown in FIG. 2.

Referring now to FIGS. 2 and 3 in which one embodiment of the present invention is illustrated, an apparatus for inspecting the configuration of terminal legs of an electronic device comprises a flat base 21 on which an electronic device 1 to be inspected is supported. In this context, the flat base 21 is means for supporting the electronic device to be inspected at a predetermined position.

At a predetermined distance above the electronic device 1 placed on the base 21, a distance sensor 3 including a light emitting element 4 and a light receiving element 5 is disposed. When the terminal legs 2 are in two arrays on both sides of the electronic device 1, a distance sensor 3 should be provided for each terminal leg array as best seen from FIG. 3. The element 4 emits a narrow beam of light toward the terminal legs 2 of the electronic device 1, and the element 5 receives light reflected from the terminal legs 2 or the surface of the base 21 according to the position on which the light beam falls. The received light is converted into an electrical signal which is processed to determine the distance between the distance sensor 3 and the point at which the light beam reflects on the electronic device to be inspected. The light beam is directed to the terminal legs 2 of the device 1 so that the configuration of the legs 2 can be inspected as more fully described later. The distance sensor 3 is arranged to provide an output signal representative of the distance between the sensor 3 and the point on the terminal legs to a signal processing circuit 17.

The distance sensor 3 is mounted on a mounting block 6 movable relative to the electronic device 1 by means of drive means including a pair of guide rods 8 on which the block 6 is slidably movable, a lead screw 7 rotatably engaged with a lead nut (not shown) mounted on the block 6 and a stepping motor 9 for driving the lead screw 7. When the motor 9 rotates at a constant speed, the distance sensor 3 moves at a constant speed along the guide rods 8 which extend in parallel to the direction of alignment of the terminal legs 2, thereby to move the beam of light from the distance sensor 3 across the terminal legs 2 of the electronic device 1 to be inspected. Therefore, the output signal from the distance sensor 3 varies not only according to the horizontal position of the terminal legs but also according to the distance of the terminal legs 2 from the distance sensor 3. Thus, the output signal supplied from the distance sensor 3 has a substantially rectangular wave form 24 as shown by a solid line in FIG. 7 and represents a measured profile of the terminal legs 2 of the electronic device 1 along a predetermined path extending across the terminal legs 2 of the electronic device 1 to be inspected.

Figure 5:
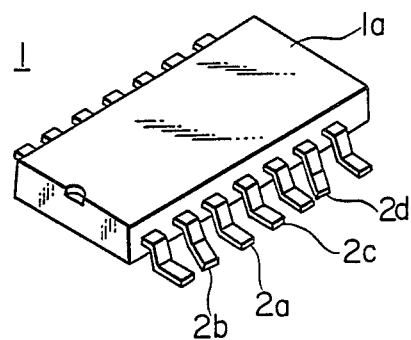
FIG. 5 is a perspective view of an electronic device with arrays of terminal legs including bent legs.
Figure 6:
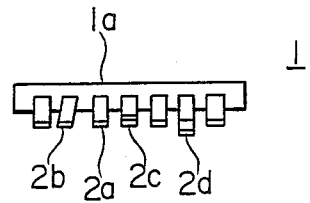
FIG. 6 is a side view of the electronic device shown in FIG. 5.
Figure 7:
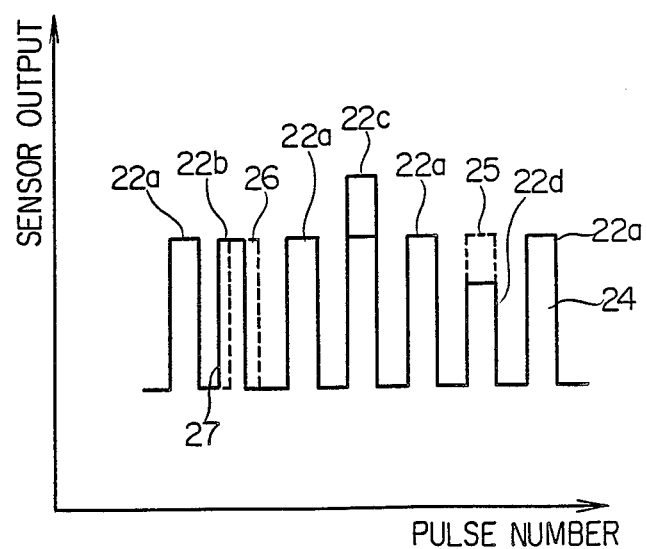
FIG. 7 is a graph showing measured and reference profiles of terminal legs for comparison purposes.

In the illustrated example in which an electronic device 1 illustrated in FIGS. 5 and 6 is to be inspected, the electronic device 1 has seven terminal legs 2 on one side, out of which the first, the third, the fifth and the seventh legs 2a are normal and positioned at their respective correct positions. The second terminal leg 2b is bent forward from its correct position, the fourth terminal leg 2c is bent upward from its proper position, and the sixth terminal leg 2d is bent downward from its correct position. When this array of terminal legs 2 is inspected, the measured profile of the terminal legs or the output from the distance sensor 3 as it is moved along the terminal leg array is the one as shown in the waveform 24. In FIG. 7, the first, the third, the fifth and the seventh rectangular pulses 22a correspond to the correct terminal legs 2a. The second pulse 22b which is shifted forward as compared to a reference pulse 26 shown by a dashed line corresponds to the second terminal leg 2b. The fourth pulse 22c of which amplitude is higher than the reference pulse 25 shown by a dashed line corresponds to the upwardly shifted terminal leg 2c. The sixth pulse 22d which has a lower amplitude than the reference pulse 25 corresponds to the downwardly bent terminal leg 2d. In FIG. 7, the substantially rectangular waveform 25 indicated by a dashed line is in an overlapping relationship with the measured profile 24 of the terminal legs 2a. This waveform 25 represents a reference profile for the terminal legs 2 indicating a desired or correct configuration of the terminal legs 2.

Comparing the measured profile 24 with the reference profile 25, it is seen that the second pulse 22b has a leading edge 26 which is shifted from the leading edge 27 of the reference pulse 25. It is also seen that the fourth pulse 22c has an amplitude higher than the reference pulse 25 and that the sixth pulse 22d has an amplitude lower than the reference pulse 25.

Figure 4:
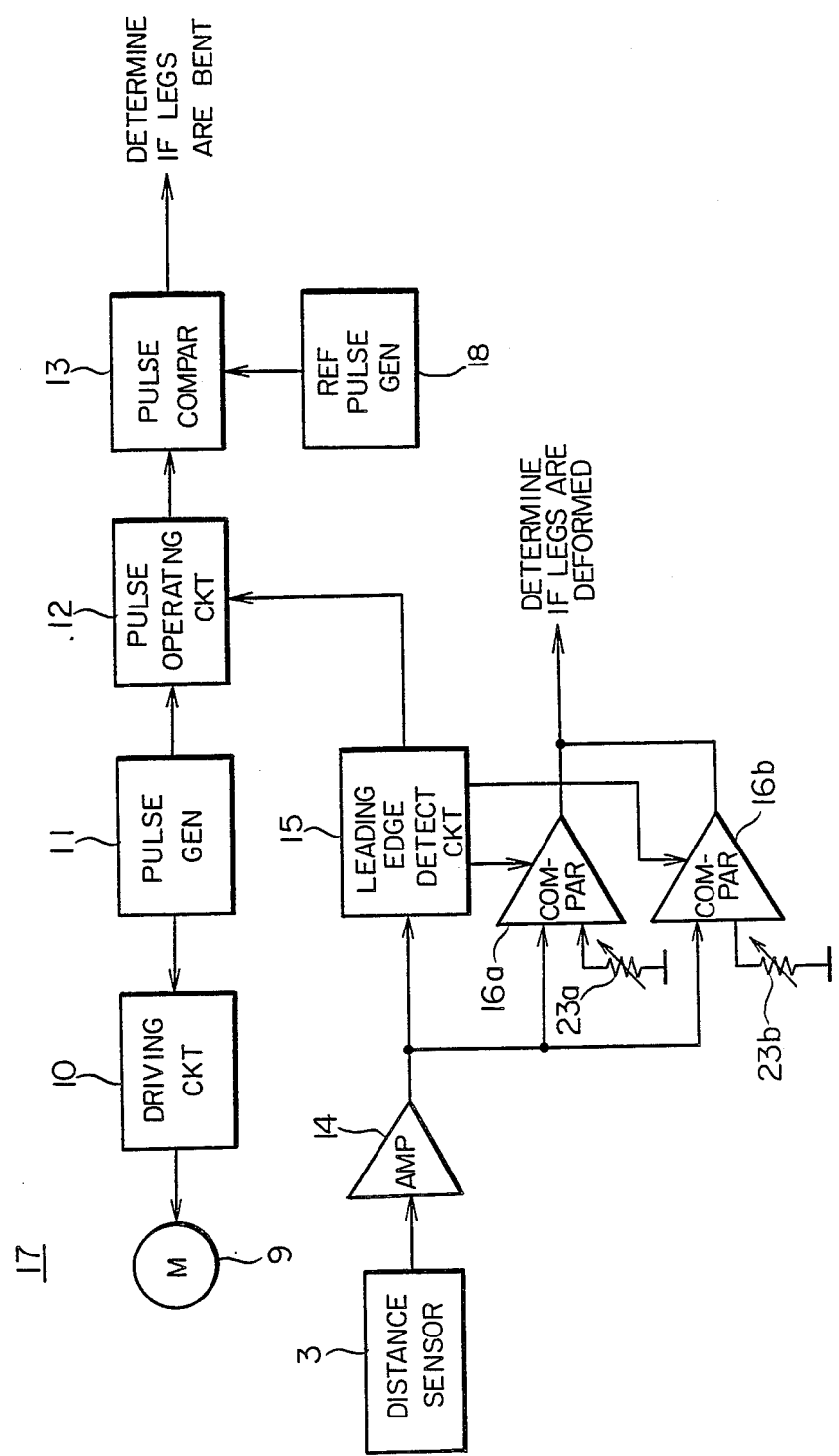
FIG. 4 is a block diagram of a signal processing circuit shown in FIG. 2.

As shown in FIG. 4, the signal processing circuit 17 comprises comparing means 16 connected to the distance sensor 3 through an amplifier 14. The comparing means 16 includes a pair of comparators 16a and 16b for comparing the amplitude of the output from the amplifier 14 with higher and lower values in order to determine whether the terminal legs 2 are at a position higher than a desired position or at a position lower than the desired position. In order to activate the comparators 16a and 16b, they are connected to a leading edge detection circuit 15 which detects the leading edges of the substantially rectangular waveform of the output signal from the distance sensor 3 so that each time the leading edges are detected, the circuit 15 provides a leading edge signal and activates the comparators 16a and 16b. Variable resistors 23a and 23b provide reference values. Thus, the comparators 16a and 16b can determine whether or not the terminal legs 2 of the electronic device 1 are positioned at a desired predetermined distance from the distance sensor 3.

The signal processing circuit 17 also comprises interval comparing means for comparing the interval of the change of the amplitude of the output from the distance sensor 3 with that of a reference signal to determine whether or not the terminal legs 2 of the electronic device 1 are positioned at a desired predetermined distance from each other. In the illustrated embodiment, the interval comparing means comprises the leading edge detection circuit 15 connected to the amplifier 14 for detecting the leading edges of the substantially rectangular wave form of the output signal from the distance sensor 3. Each time a leading edge is detected, the circuit 15 provides a leading edge signal to a pulse operating circuit 12, where the number of pulses supplied from a pulse generator 11 during a time interval between a leading edge signal and the next leading edge signal are counted. The circuit 12 provides an output signal indicative of the distance between a first and a second leading edge of the terminal legs 2 in the form of the number of pulses. This output signal is supplied to a pulse comparison circuit 13 where the pulse number signal supplied from the pulse operating circuit 12 is compared with a reference pulse number supplied from a reference pulse number generator 18 which corresponds to a desired correct horizontal distance between the leading edges of the terminal legs 2 of the electronic device 1 to be inspected. When the two numbers are different, it is determined that the terminal legs 2 are not in correct horizontal position.

The pulse generator 11 is also connected to the stepping motor 9 through a driving circuit 10 for driving the distance sensor 3 along the predetermined travel path.

In summary, the signal processing circuit 17 comprises reference signal generating means, which includes the variable resistors 23a and 23b and the reference pulse number generator 18, for generating a reference signal having a substantially rectangular waveform 25 as shown by a dashed line in FIG. 7. This reference signal is representative of a reference profile of the terminal legs 2 of the electronic device 1 across the terminal leg array along a predetermined path. The signal processing circuit 17 also comprises a determination circuit, which comprises the comparators 16a and 16b and the pulse comparison circuit 13, connected to the distance sensor 3 and the reference signal generating means (the resistors 23a and 23b and the reference pulse number generator 18) for comparing the measured profile 24 of the terminal legs 2 in the form of a substantially rectangular waveform as shown by a solid line in FIG. 7 with the reference profile 25 of the terminal legs 2 to determine whether or not the terminal legs 2 of the electronic device 1 being inspected are deformed based on any discrepancy between the measured profile 24 and the reference profile 25.

According to the above embodiment, although a pulse driven stepping motor is used as drive means, any other drive means may be used as far as it provides the same operation as the pulse drive means, such as a linear stepping motor drive and a turbo motor drive.

What is claimed is:

1. An apparatus for inspecting the configuration of terminal legs of an electronic device, comprising:

means for supporting the electronic device to be inspected at a predetermined position;

distance sensor means, disposed at a predetermined distance from the electronic device, for measuring the distance to a particular point on a predetermined travel path across the terminal legs of the electronic device by a beam of light, said distance sensor means providing an output signal representative of the distance between the sensor and the point on said predetermined travel path across the terminal legs;

drive means for providing a relative movement between said distance sensor means and the electronic device at a predetermined speed along said predetermined travel path, thereby to move the beam of light across the terminal legs of the electronic device to be inspected so that said distance sensor provides an output signal indicative of a measured profile of the terminal legs of the electronic device along said predetermined path; and signal processing means including reference signal generating means for generating a reference signal representative of a reference profile of the teminal legs of the electronic device along said predetermined path, and a determination circuit connected to said distance sensor means and said reference signal generating means for comparing said measured profile of the terminal legs with said reference profile of the terminal legs to determine whether or not the terminal legs of the electronic device being inspected are deformed based on any discrepancy between said measured profile and said reference profile.

2. An apparatus as claimed in claim 1, wherein said signal processing means comprises means for comparing the amplitude of the output from said distance sensor means with the amplitude of the reference signal for determining whether or not the terminal legs of the electronic device are positioned at a predetermined distance from said distance sensor, and means for comparing the interval of the change of the amplitude of the output from said distance sensor means with that of the reference signal to determimne whether or not the terminal legs of the electronic device are positioned at a predetermined distance from each other.

3. An apparatus as claimed in claim 1, wherein said drive means is a stepping motor connected to a pulse generator circuit, and said interval comparing means comprises a leading edge detection circuit connected to said distance sensor for detecting the leading edge of the rectangular waveform of said output from said distance sensor and providing an output indicative of the time point of the occurence of the leading edge, a pulse counting circuit connected to said leading edge detection circuit and said pulse generator circuit for counting the number of the reference pulses from said pulse generator circuit between two consecutive leading edges of the output from said distance sensor, and a pulse comparison circuit connected to said pulse counting circuit for comparing the output from said pulse counting circuit with a reference pulse signal.

* * * * *